(12) United States Patent
Jiang et al.

(10) Patent No.: US 7,919,784 B2
(45) Date of Patent: Apr. 5, 2011

(54) SEMICONDUCTOR LIGHT-EMITTING DEVICE AND METHOD FOR MAKING SAME

(75) Inventors: Fengyi Jiang, Nanchang (CN); Li Wang, Jiang Xi (CN); Wenqing Fang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 186 days.

(21) Appl. No.: 12/063,978

(22) PCT Filed: Sep. 29, 2006

(86) PCT No.: PCT/CN2006/002584
§ 371 (c)(1),
(2), (4) Date: Feb. 15, 2008

(87) PCT Pub. No.: WO2007/036164
PCT Pub. Date: Apr. 5, 2007

(65) Prior Publication Data
US 2008/0230792 A1    Sep. 25, 2008

(30) Foreign Application Priority Data
Sep. 30, 2005    (CN) .......................... 2005 1 0030321

(51) Int. Cl.
*H01L 33/00*    (2010.01)
(52) U.S. Cl. ....... 257/94; 257/79; 257/86; 257/E33.048; 257/E33.051
(58) Field of Classification Search ............... 257/86–87, 257/94, 99, E33.048, E33.051, E33.062–E33.063, 257/E33.065
See application file for complete search history.

(56) References Cited

U.S. PATENT DOCUMENTS

| | | | | |
|---|---|---|---|---|
| 6,169,296 B1 * | 1/2001 | Kamiyama et al. | ............. | 257/94 |
| 6,258,614 B1 * | 7/2001 | Kaneko | ........................... | 438/22 |
| 6,707,071 B2 * | 3/2004 | Hashimoto et al. | ............. | 257/94 |
| 2002/0014630 A1 * | 2/2002 | Okazaki et al. | ................. | 257/79 |
| 2002/0050601 A1 * | 5/2002 | Saeki et al. | .................... | 257/103 |
| 2002/0074556 A1 * | 6/2002 | Kwak et al. | ..................... | 257/79 |
| 2002/0117677 A1 * | 8/2002 | Okuyama et al. | ............... | 257/94 |
| 2002/0125488 A1 * | 9/2002 | Hashimoto et al. | ............. | 257/79 |
| 2005/0184300 A1 * | 8/2005 | Tazima et al. | ................... | 257/94 |
| 2006/0001032 A1 * | 1/2006 | Murofushi et al. | ............. | 257/79 |

OTHER PUBLICATIONS

S. M. Sze "Semiconductor devices. Physics and Technology. 2nd Edition"—© 2002 John Wiley and Sons, p. 292, fig. 10.*

* cited by examiner

*Primary Examiner* — N Drew Richards
*Assistant Examiner* — Mamadou Diallo
(74) *Attorney, Agent, or Firm* — Park, Vaughan, Fleming & Dowler LLP; Shun Yao

(57) ABSTRACT

One embodiment of the present invention provides a semiconductor light-emitting device, which comprises: an upper cladding layer; a lower cladding layer; an active layer between the upper and lower cladding layers; an upper ohmic-contact layer forming a conductive path to the upper cladding layer; and a lower ohmic-contact layer forming a conductive path the lower cladding layer. The lower ohmic-contact layer has a shape substantially different from the shape of the upper ohmic-contact layer, thereby diverting a carrier flow away from a portion of the active layer which is substantially below the upper ohmic-contact layer when a voltage is applied to the upper and lower ohmic-contact layers.

11 Claims, 6 Drawing Sheets

SEMICONDUCTOR LIGHT-EMITTING DEVICE AND METHOD FOR MAKING SAME

BACKGROUND

1. Field of the Invention

The present invention relates to the design of semiconductor light-emitting devices. More specifically, the present invention relates to novel device structures which facilitate more efficient light emission.

2. Related Art

Solid-state lighting is expected to be the illumination wave of the future. High-brightness light-emitting diodes (HB-LEDs) are beginning to penetrate an increasing number of applications, especially as the light source for display devices and as light-bulb replacement for conventional lighting. Higher light-emission efficiency, like for conventional incandescent or florescent lights, remains a challenge for LED designers.

An LED typically produces light from an active region which is situated between a positively-doped cladding layer (p-type cladding layer) and negatively-doped cladding layer (n-type cladding layer). When the LED is forward-biased, the carriers, which include holes from the p-type cladding layer and electrons from the n-type cladding layer, recombine in the active region. For direct band-gap materials, this recombination process releases energy in the form of photons, or light, whose wavelength corresponds to the energy band-gap of the material in the active region.

To improve the light-emission efficiency, it is critically important for emitted light to leave the device promptly, so that the light is not absorbed by the inactive materials in the device. Unlike laser devices, wherein emitted light is guided and propagates in a common, well-defined direction, the light emitted in an LED propagates omni-directionally. Hence, a portion of the light is reflected off certain internal surfaces, absorbed, or is obstructed by non-transparent materials within the device.

The light-obstruction issue is particularly pronounced in an LED with a vertical-electrode structure, that is, the entire device is situated between an upper and lower electrodes. An electrode is typically made of metal, which is non-transparent to visible light. When a significant overlap exists between the upper and lower electrodes, the electrodes can obstruct a substantial amount of vertically emitted light. In addition, more carriers recombine in the active region which coincides with the overlapped area, since this region typically is part of a low-resistance path between the electrodes. The concentration of carriers in this undesirable location further exacerbates the vertical-light obstruction problem.

Hence, what is needed is an LED structure that mitigates the vertical-light obstruction problem and a method for fabricating such a structure.

SUMMARY

One embodiment of the present invention provides a semiconductor light-emitting device, which comprises: an upper cladding layer; a lower cladding layer; an active layer between the upper and lower cladding layers; an upper ohmic-contact layer forming a conductive path to the upper cladding layer; and a lower ohmic-contact layer forming a conductive path to the lower cladding layer. The lower ohmic-contact layer has a shape substantially different from the shape of the upper ohmic-contact layer, thereby diverting a carrier flow away from a portion of the active layer which is substantially below the upper ohmic-contact layer when a voltage is applied to the upper and lower ohmic-contact layers.

In a variation of this embodiment, the shape of the lower ohmic-contact layer is substantially complementary to the shape of the upper ohmic-contact layer, thereby allowing the carrier flow to be concentrated in the portion of the active layer where light emitted upward is not substantially obstructed by the upper ohmic-contact layer.

In a further variation, a portion of the lower ohmic-contact layer is not present at a region substantially below the upper ohmic-contact layer. The region where the lower ohmic-contact layer is not present contains a high-resistance material or a material that can form a Schottky or high-resistance contact with the lower cladding layer.

In a further variation, the material contained in the region where the lower ohmic-contact layer is not present comprises one of: $SiO_2$, Au, Al, and Ag.

In a further variation, the material contained in the region where the lower ohmic-contact layer is not present is reflective with regard to the wavelength of the light emitted by the active layer.

In a variation of this embodiment, the device further includes a layer of high-resistance material situated between the lower cladding layer and the lower ohmic-contact layer. The high-resistance material is confined to a region substantially below the upper ohmic-contact layer, thereby reducing carrier recombination occurring below the upper ohmic-contact layer which can obstruct light emitted upward.

In a variation of this embodiment, the device further includes a bonding-material layer below the lower ohmic-contact layer and a low-resistance substrate below the bonding-material layer, wherein the low-resistance substrate comprises Si, and the upper and lower cladding layers comprise n-type GaN and p-type GaN, respectively. Additionally, the active layer comprises an InGaN/GaN multi-quantum-well structure, and the bonding-material layer comprises Au.

A further embodiment of the present invention provides a semiconductor light-emitting device, which comprises: an upper cladding layer, a lower cladding layer, an active layer between the upper and lower cladding layers, an upper ohmic-contact layer forming a conductive path to the upper cladding layer, and a lower ohmic-contact layer forming a conductive path to the lower cladding layer. Furthermore, a portion of the lower cladding layer, or a portion of the active layer, or both, is not present at a region substantially below the upper ohmic-contact layer, thereby reducing carrier recombination below the upper ohmic-contact layer which causes light emitted upward to be obstructed by the upper ohmic-contact layer.

In a variation of this embodiment, the region where the portion of the lower cladding layer, or the portion of the active layer, is not present contains a high-resistance material.

In a variation of this embodiment, the shape of the lower cladding layer or the active layer is substantially complementary to the shape of the upper ohmic-contact layer.

One embodiment of the present invention provides a method for fabricating a semiconductor light-emitting device. The method comprises forming a layered semiconductor structure on a growth substrate, wherein the layered semiconductor structure comprises an n-type semiconductor layer, an active layer, and a p-type semiconductor layer. The method further comprises: forming a first ohmic-contact layer with a conductive path to a first side of the layered structure, removing a portion of the first ohmic-contact layer, form a bonding-material layer over the first ohmic-contact layer, bonding a low-resistance substrate onto the bonding-material layer, removing the growth substrate to expose a second side of the layered structure, and forming a second ohmic-contact layer with a conductive path to the second side of the layered structure. The second ohmic-contact layer is confined within a region which substantially corresponds to the region where the portion of the first ohmic-contact layer is removed, thereby diverting carrier flow away from a portion within the active layer where vertically emitted light can be substantially obstructed by the second ohmic-contact layer.

In a variation of this embodiment, the shape of the second ohmic-contact layer is substantially complementary to the shape of the first ohmic-contact layer.

In a variation of this embodiment, the method further comprises filling the region where the portion of the first ohmic-contact layer is removed with a high-resistance material or a material that can form a Schottky or high-resistance contact with the layered structure.

In a further variation, the material used to fill the region where the portion of the first ohmic-contact layer is removed comprises one of: $SiO_2$, Au, Al, and Ag.

In a variation of this embodiment, the first ohmic-contact layer comprises a material that is reflective with regard to the wavelength of the light emitted by the active layer.

One embodiment of the present invention provides a method for fabricating a semiconductor light-emitting device. The method comprises forming a layered semiconductor structure on a growth substrate, wherein the layered semiconductor structure comprises an n-type semiconductor layer, an active layer; and a p-type semiconductor layer. The method further comprises forming a high-resistance-material region which is confined to an area on a first side of the layered structure, forming a first ohmic-contact layer with a conductive path to the first side of the layered structure, wherein the first ohmic-contact layer covers the high-resistance-material region, forming a bonding-material layer over the first ohmic-contact layer, bonding a low-resistance substrate onto the bonding-material layer, removing the growth substrate to expose a second side of the layered structure, and forming a second ohmic-contact layer with a conductive path to the second side of the layered structure. The second ohmic-contact layer is confined within a region which substantially corresponds to the high-resistance-material region, thereby diverting carrier flow away from a portion within the active layer where emitted light can be substantially obstructed by the second ohmic-contact layer.

In a variation of this embodiment, the shape of the second ohmic-contact layer is substantially the same as the shape of the high-resistance-material region.

One embodiment of the present invention provides a method for fabricating a semiconductor light-emitting device. The method comprises forming a layered semiconductor structure above a growth substrate, wherein the layered semiconductor structure comprising an n-type semiconductor layer, an active layer, and a p-type semiconductor layer. The method further comprises removing a portion of the p-type layer, filling the region where the p-type layer is removed with a high-resistance material, forming a first ohmic-contact layer with a conductive path to the first side of the layered structure, wherein the first ohmic-contact layer covers the high-resistance-material region, forming a bonding-material layer over the first ohmic-contact layer, bonding a low-resistance substrate onto the bonding-material layer, removing the growth substrate to expose a second side of the layered structure, and forming a second ohmic-contact layer with a conductive path to the second side of the layered structure. The second ohmic-contact layer is confined within a region which substantially corresponds to the high-resistance-material region, thereby diverting carrier flow away from a portion within the active layer where vertically emitted light can be substantially obstructed by the second ohmic-contact layer.

In a variation of this embodiment, the shape of the second ohmic-contact layer is substantially complementary to the shape of the high-resistance-material region.

In a variation of this embodiment, the high-resistance-material region penetrates the p-type layer.

In a variation of this embodiment, the method further comprises removing a portion of the active layer and filling the region where the active layer is removed with a high-resistance material.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Obstruction of Vertically Emitted Light

Figure 1:
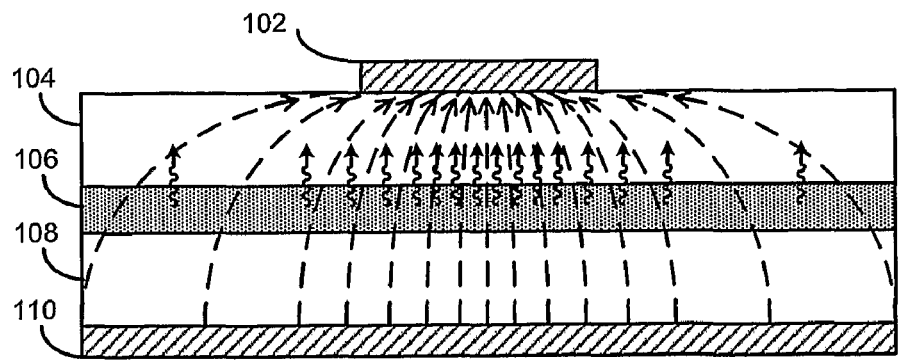
FIG. 1 illustrates an LED structure with vertical electrodes which obstruct vertically emitted light.

Generally, the two electrode of an LED can be placed on the same side of the substrate (lateral electrodes) or on different sides of the substrate (vertical electrodes). Vertical-electrode configuration is a preferred design due to its ease of packaging and better reliability. FIG. 1 illustrates a typical LED structure with vertical electrodes.

An active layer 106 is "sandwiched" between an upper layer 104 and a lower layer 108. Note that upper layer 102 or lower layer 108 can include additional layers, such as an n-type or p-type cladding layer, a substrate layer, or a buffer layer. Further, a cladding layer can include one or more layers of material, although "cladding layer" as used in some literature refers only to a doped layer immediately adjacent to the active layer.

Above upper layer 104 is an upper electrode 102, which is a layer of conductive or low-resistance material. Below lower layer 108 is a lower electrode 110, which is also a layer of conductive or low-resistance material. In one embodiment, upper electrode 102 and lower electrode 110 are both ohmic-contact layers. Note that an ohmic-contact layer can form an ohmic contact with an adjacent layer and typically exhibit a low resistance. An ohmic-contact layer can be based on one or more metal, alloy, or compound materials, such as Pt, Ni, NiO, and ITO (indium tin oxide). In a further embodiment, upper layer 104 includes a negatively doped layer, or n-type layer, and lower layer 108 includes a positively doped layer, or p-type layer.

As is shown in FIG. 1, when the LED is forward biased beyond its turn-on threshold, the holes from the p-type layer recombine with the electrons from the n-type layer in active layer 106. Consequently, the carrier flow creates a current, represented as dashed lines, between electrodes 102 and 110. The distribution of this current across active layer 106 depends on the resistance distribution between the electrodes, because the current tends to concentrate at locations with lower resistance. Since the lowest-resistance path between the electrodes is directly below upper electrode 102, the region of active layer 106 that is directly below upper electrode 102 has the highest current density. Correspondingly, the most carrier recombination occurs in this region. This "current crowding" phenomenon is more pronounced when the LED's layered structure is relatively thin, because the lateral resistance in the layered structure can be significantly higher than the vertical resistance. As a result of this "current crowding," a significant portion of the vertically emitted light is obstructed by upper electrode 102.

Note that lower electrode 110 also obstructs downward-propagating light. However, it is possible to use reflective materials for lower electrode 110 so that lower electrode 110 can reflect a significant portion of the light.

Manipulating Carrier Flow by Modifying Resistance Distribution

Embodiments of the present invention mitigate the vertical-light obstruction problem by manipulating the carrier flow in a device so that majority of the carrier recombination occurs in an active-layer region where vertically emitted light is not obstructed by the upper electrode. Such manipulation is achieved by modifying the resistance distribution across the metal, cladding, and/or the active layer.

One embodiment of the present invention modifies the effective resistance distribution across the LED's layered structure by using specially shaped electrodes. For example, the upper and lower electrodes have substantially complementary shapes, so that the overlapped area between the vertical projections of the electrodes on a horizontal projection plane is significantly reduced. In this way, majority of the carrier recombination can occur in active-layer regions where upward-propagating light is not obstructed by the upper electrode.

Figure 2:
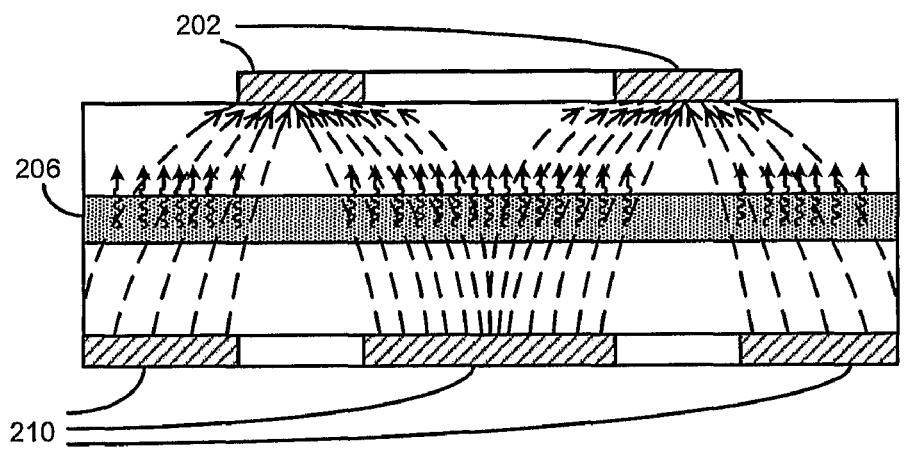
FIG. 2 illustrates an LED structure with substantially complementary vertical electrodes in accordance with one embodiment of the present invention.
Figure 5:
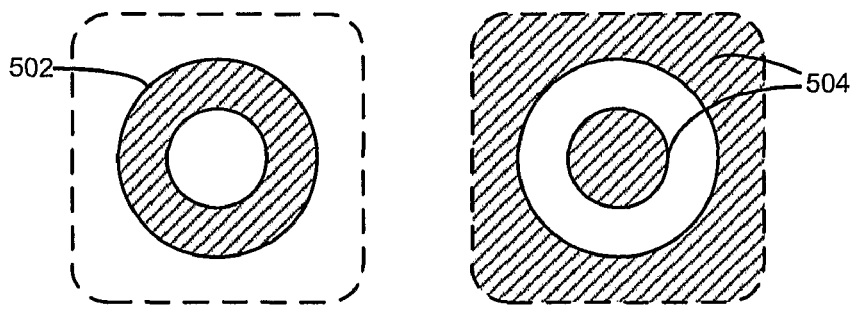
FIGS. 5-12 illustrate examples of complementary upper and lower electrodes in accordance with embodiments of the present invention.

FIG. 2 illustrates an LED structure with substantially complementary vertical electrodes in accordance with one embodiment of the present invention. In this example, an upper electrode 202 is of the shape of a ring, and a lower electrode 210 is an ohmic-contact layer with a portion removed, wherein the removed portion corresponds to the shape of upper electrode 202. FIG. 5 presents a top view of the these electrodes. The removed portion in ohmic-contact layer 210 is then filled with a high-resistance material. Note that "high-resistance material" as used herein can include insulating materials, materials with a resistivity that is substantially higher than that of a metal or the cladding layer, or materials which can form a high-resistance contact with a metal or cladding layer. In one embodiment, the high-resistance material can be an insulator material, such as $SiO_2$, SiN, or $Al_2O_3$. In a further embodiment, the high-resistance material can be a conductive metal, such as Au or Cr, which can form a Schottky contact with a cladding layer.

When the LED is forward biased, the carrier recombination occurs in regions in an active layer 206 which correspond to the "inside" and "outside" of the ring shape. Consequently, majority of the light propagating upward can travel freely to the upper surface of the layered structure without obstruction by upper electrode 202.

Note that strictly complementary electrode shapes is optional in the present invention for mitigating the light-obstruction problem. Generally, different electrode shapes can also achieve similar results. Having "substantially complementary shapes," as used herein, means having substantial upper and lower electrode areas whose vertical projections do not overlap. In one embodiment, the overlapped area is less than 100%, preferably less than 50%, of the area of the upper electrode. Additionally, the upper and lower electrodes can have shapes whose vertical projections do not overlap at all, so long as the electrodes can retain sufficient connection with wires or do not impair the LED's luminescence efficiency. In one embodiment, the un-overlapped area between the upper and lower electrodes does not exceed five times the area of the upper electrode.

Figure 3:
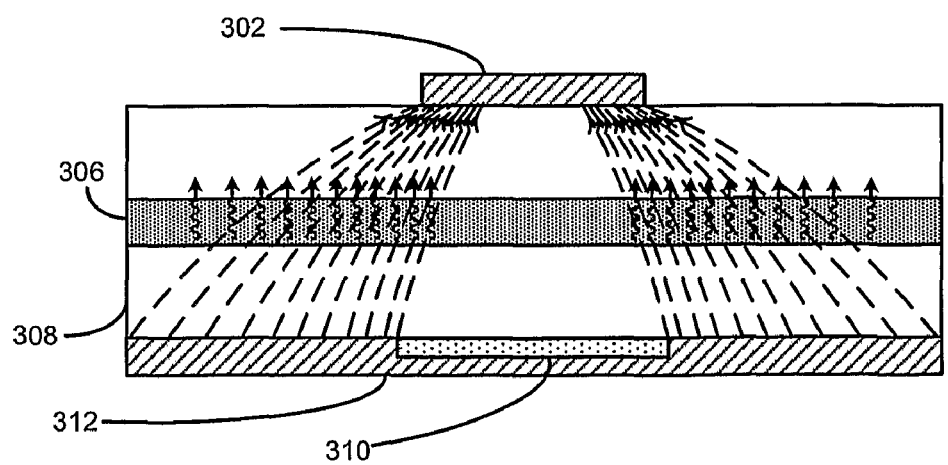
FIG. 3 illustrates an LED structure with a high-resistance layer situated between the lower cladding layer and lower ohmic-contact layer in accordance with one embodiment of the present invention.

Besides using specially shaped electrodes, other modifications, additions, or reductions of the materials in the layered LED structure can also change the resistance distribution. In one embodiment, as is shown in FIG. 3, a layer of high-resistance material 310 is first placed between the lower cladding layer and the lower electrode. A portion of high-resistance layer 310 is then removed, so that its shape is substantially complementary to the shape of an upper electrode 302.

After a lower electrode 312, which in one embodiment is a layer of metal, is deposited or epitaxially grown, only part of this ohmic-contact layer can form a conductive path to a lower layer 308 due to high-resistance material layer 310. As a result, the carrier flow through the region of an active layer 306 which is in the "shadow," or the vertical projection, of the upper electrode, is reduced, and the carrier flow through other regions of active layer 306 is increased. Thus, a significant amount of light emitted upward can propagate to and leave the upper surface of the device without being obstructed by upper electrode 302. Note that in this example, upper electrode 302 is of a circular shape, and high-resistance layer 310 is of a similar circular shape with a slightly larger area. Note further that the shape of high-resistance layer 310 does not need to match exactly the shape of upper electrode 302. A smaller or larger high-resistance layer is also possible.

Figure 4:
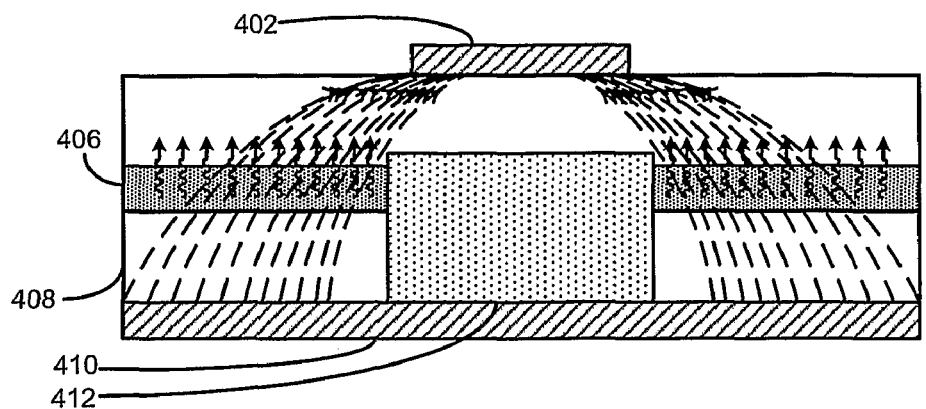
FIG. 4 illustrates an LED structure wherein a portion of the lower cladding layer and active layer is removed and replaced by a high-resistance material in accordance with one embodiment of the present invention.

In a further embodiment, a portion of a cladding and/or active layer is removed and replaced by a high-resistance material to divert carrier flow to non-obstructed regions. As is shown in FIG. 4, a portion of a lower layer 408 and an active layer 406 is removed and replaced by a high-resistance material 412. The vertical projection of high-resistance material 412 substantially overlaps with the vertical projection of upper electrode 402. Note that in one embodiment, only a portion of lower layer 408 is removed and replaced by high-resistance material, whereas active layer 406 remains intact. In a further embodiment, high-resistance material 412 can penetrate both lower layer 408 and active layer 406. In yet a further embodiment, only a portion of active layer 406, but not lower layer 408, is removed and replaced by high-resistance material. Other configurations are also possible, so long as the placement of high-resistance material 412 can reduce carrier flow below upper electrode 402.

When a forward-bias voltage is applied across upper electrode 402 and a lower electrode 410, carriers flow around high-resistance material 412, as indicated by the dashed lines. As a result, upper electrode 402 cannot obstruct upward-propagating light.

FIGS. 5-12 illustrate examples of complementary upper and lower electrodes in accordance with embodiments of the present invention. Note that these shapes can also reflect the shapes of effective low-resistance conductive regions on the upper and lower electrodes in devices with buried high-resistance layers, such as those illustrated in FIGS. 3 and 4.

FIG. 5 illustrates an upper electrode 502 which is of a ring shape, and a lower electrode 504 with a portion removed. The removed portion of lower electrode 504 substantially corresponds to upper electrode 502, and is replaced with a high-resistance material. Note that the area defined by the dashed line represents the top view of an upper layer below the upper electrode, or a lower layer above the lower electrode.

Figure 6:
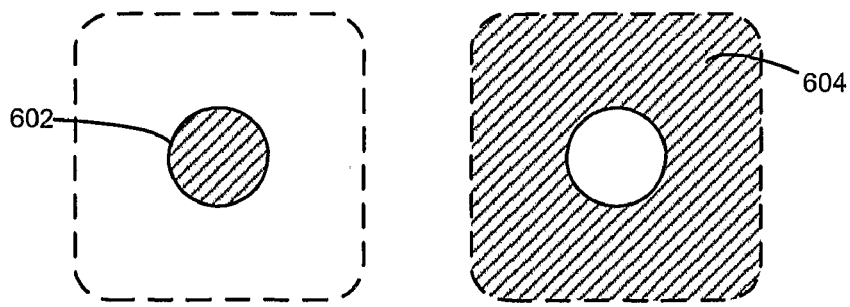

FIG. 6 illustrates an upper electrode 602 which is of a circular shape, and a lower electrode 604 with a portion removed. The removed portion of lower electrode 604 substantially corresponds to upper electrode 602, and is replaced with a high-resistance material.

Figure 7:
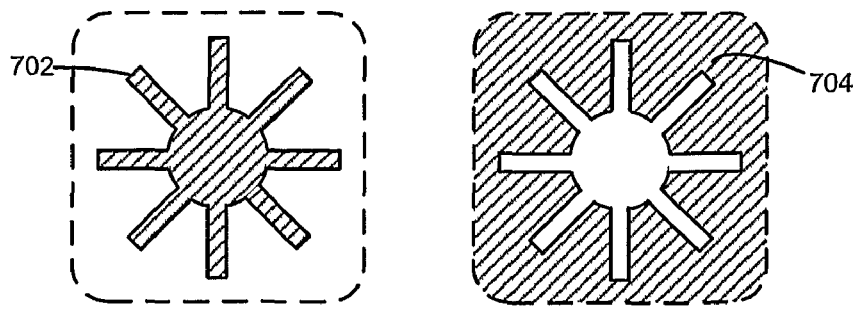

FIG. 7 illustrates an upper electrode 702 which is of a star shape, and a lower electrode 704 with a portion removed. The removed portion of lower electrode 704 substantially corresponds to upper electrode 702, and is replaced with a high-resistance material.

Figure 8:
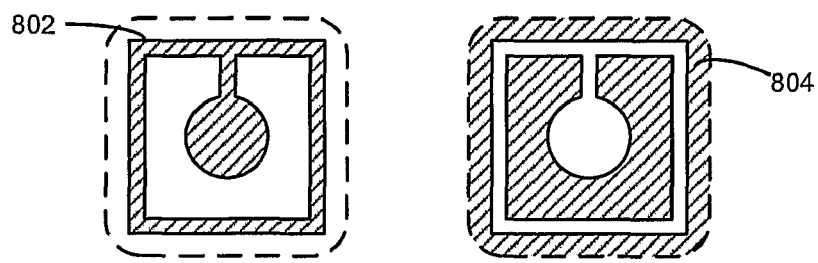

FIG. 8 illustrates an upper electrode 804 which is of an irregular shape, and a lower electrode 804 which a portion removed. The removed portion of lower electrode 804 substantially corresponds to upper electrode 804, and is replace with a high-resistance material.

Figure 9:
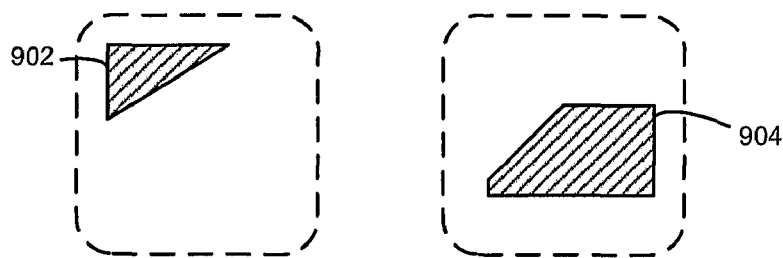

Note that substantially complementary electrodes do not need to have exactly matching shapes. FIG. 9 illustrates an upper electrode 902 which is of a triangular shape, and a lower electrode 904 with a substantially different shape. The area around lower electrode 904 is filled with a high-resistance material.

Figure 10:
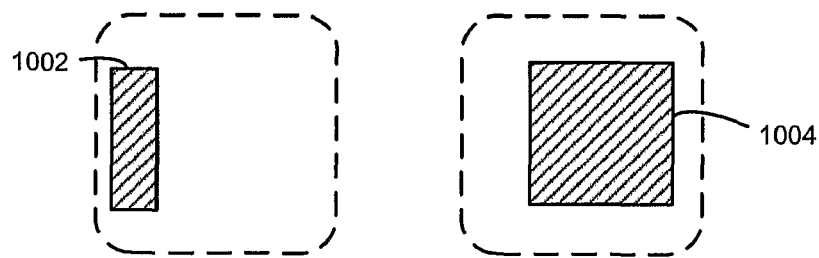

FIG. 10 illustrates an upper electrode 1002 which is of the shape of a strip, and a lower electrode 1004 which is of the shape of a square. Note that the vertical projections of upper electrode 1002 and lower electrode 1004 do not overlap at all. The area around lower electrode 1004 is filled with a high-resistance material.

Figure 11:
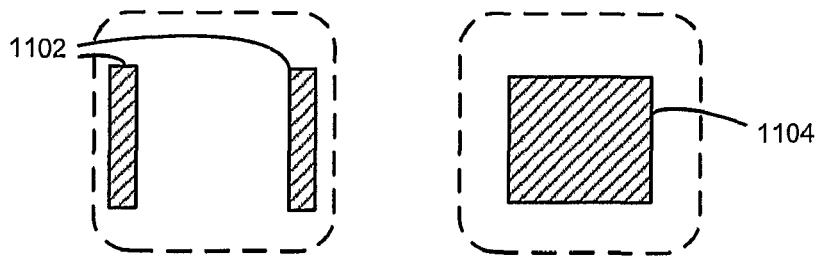

FIG. 11 illustrates an upper electrode 1104 which includes two strip-shaped metal parts, and a lower electrode 1104 which is of a rectangular shape. The vertical projection of lower electrode 1104 falls between the vertical projections of the two strips of upper electrode 1102. Hence, upper electrode 1102 does not overlap with lower electrode 1104. The area around lower electrode 1104 is filled with a high-resistance material.

Figure 12:
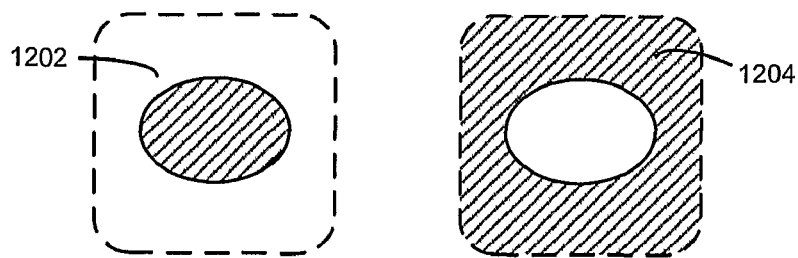

FIG. 12 illustrates an upper electrode 1202 which is of an oval shape, and a lower electrode 1204 with a portion removed. The removed portion of lower electrode 1204 substantially corresponds to upper electrode 1202, and is replaced with a high-resistance material.

Fabrication Process

The exemplary fabrication processes described below use GaN light-emitting devices as examples. However, the general device structures described herein are applicable to a wide range of semiconductor light-emitting devices. In the examples described below, an GaN-based layered structure is fabricated on a Si substrate. Typically, a buffer layer is present between the GaN-based device and the Si substrate to resolve lattice and thermal mismatch. Commonly used compounds for the buffer layer include $In_xGa_yAl_{1-x-y}N$ ($0 \leq x \leq 1$; $0 \leq y \leq 1$), $In_xGa_yAl_{1-x-y}P$ ($0 \leq x \leq 1$; $0 \leq y \leq 1$); and $In_xGa_yAl_{1-x-y}As$ ($0 \leq x \leq 1$; $0 \leq y \leq 1$). Furthermore, the devise structures described herein are applicable to a wide range of semiconductor or metal substrate materials, such as Si, GaAs, GaP, Cu, and Cr.

Figure 13:
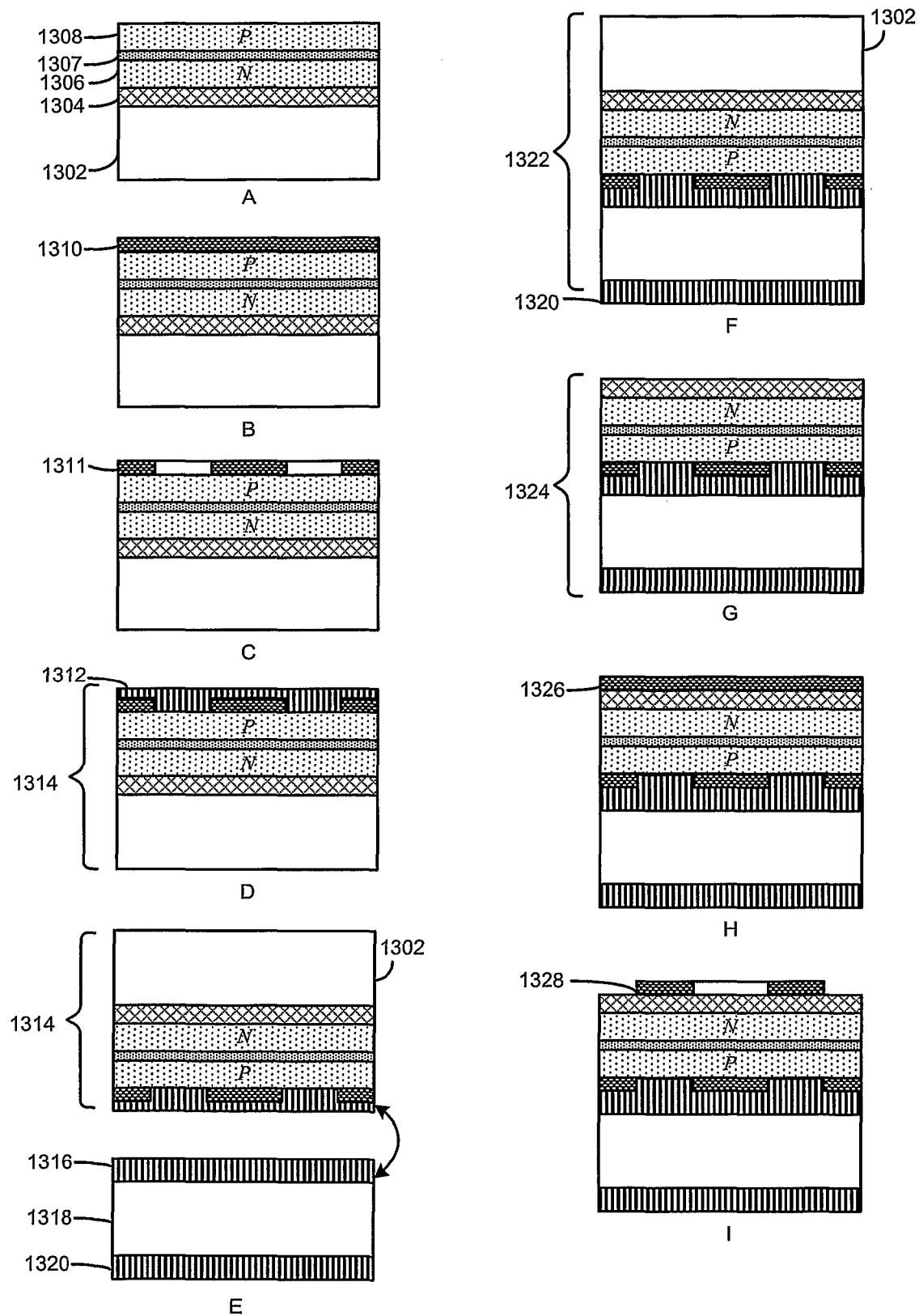
FIG. 13 illustrates a process for fabricating an LED with complementary electrodes in accordance with one embodiment of the present invention.

FIG. 13 illustrates a process for fabricating an LED with complementary electrodes, wherein the upper electrode has a ring shape. Based on a generally known InGaAlN-device fabrication process, a GaN light-emitting layered structure is first fabricated on a growth Si substrate 1302 in Step A. Typically, a buffer layer 1304 is grown on substrate 1302. An n-type GaN layer 1306 is then grown on buffer layer 1304. In one embodiment, an InGaN/GaN multi-quantum-well active layer 1307 and a p-type GaN layer 1308 are formed on n-type GaN layer 1306. Chemical vapor deposition (CVD) can be used to fabricate these layers. In a further embodiment, the layered structure is placed in a 760° C. $N_2$ environment for approximately 20 minutes for the purpose of annealing.

In Step B, an ohmic-contact layer 1310 is formed on the p-type GaN layer. In one embodiment, this fabrication step uses physical vapor deposition methods, such as electron-beam evaporation, filament evaporation, or sputter deposition. Ohmic-contact layer 1310 can also be a reflective material. Preferably, ohmic-contact layer 1310 has a reflectivity not less than 30%. In one embodiment, ohmic-contact layer 1310 comprises Pt.

Step C of the fabrication process removes portion of the ohmic-contact layer using photo lithography to produce a patterned ohmic-contact layer 1311. The removed portion corresponds to the shape of a ring. Note that ohmic-contact layer 1311 becomes the lower electrode after the structure is flipped upside down in subsequent steps.

In Step D, a bonding metal material 1312 is deposited over ohmic-contact layer 134. Bonding metal material 1312, although being a conductive material, can form a high-resistance contact with the p-type layer. In one embodiment, bonding metal material 1312 comprises Au, because Au can form a Schottky barrier with p-type GaN.

In Step E, the entire layered structure 1314 obtained in Step D is flipped upside down and bonded to a second Si substrate 1318, which is of low resistance. In addition, the bonding side of substrate 1318 is coated with a bonding metal material 1316 which is the same as bonding material 1312. On the other side of substrate 1318 is a layer of protective material 1320 which protects substrate 1318 from subsequent etching. In one embodiment, protective layer 1320 also comprises Au. Note that protective layer 1320 is generally a conductive material, so that a conductive path can form from the p-type GaN layer through bonding layer 1316, substrate 1318, and protective layer 1320.

After bonding, a layered structure 1322 which includes two substrates is formed in Step F. In Step G, growth Si substrate 1302 is removed using, for example, wet etching based on KOH or HNA. Note that the resulting structure 1324 includes substrate 1318, because protective layer 1320 protects substrate 1318 from being attacked by the etchant.

In Step H, another ohmic-contact layer 1326 is deposited on the top surface of structure 1324. Portions of ohmic-contact layer 1326 are then removed in Step I using photo lithography to produce a shaped upper ohmic-contact layer

1328. Ohmic-contact layer 1328 has a ring shape and substantially corresponds to the removed portion of lower ohmic-contact layer 1311. In general, the fabrication process illustrated in FIG. 13 can produce any substantially complementary electrode shapes, such as those illustrated in FIGS. 5-12. For example, the same process can be used to produce a star-shaped upper electrode and the corresponding lower electrode, as is illustrated in FIG. 7. In addition, the area of the removed portion of the lower electrode can be larger than the area of the upper electrode. In one embodiment, the area of the removed portion of the lower electrode is 1.5 times the area of the upper electrode.

In a further embodiment, a high-resistance material can fill the region where the lower ohmic-contact layer is removed. For example, referring to FIG. 13, after portions of ohmic-contact layer 1311 are removed in Step C, a layer of $SiO_2$ can fill the void where ohmic-contact layer 1311 is removed. The $SiO_2$ layer can then be patterned and etched to expose ohmic-contact layer 1311 which has not been removed. Bonding ohmic-contact layer 1312 is then deposited over ohmic-contact layer 1311 and the $SiO_2$ layer in Step D. Besides $SiO_2$, other conductive metals, such as Au, Al, and Ag, can also be used to fill the void, so long as the material can form a Schottky contact with p-type GaN layer 1308.

Figure 14:
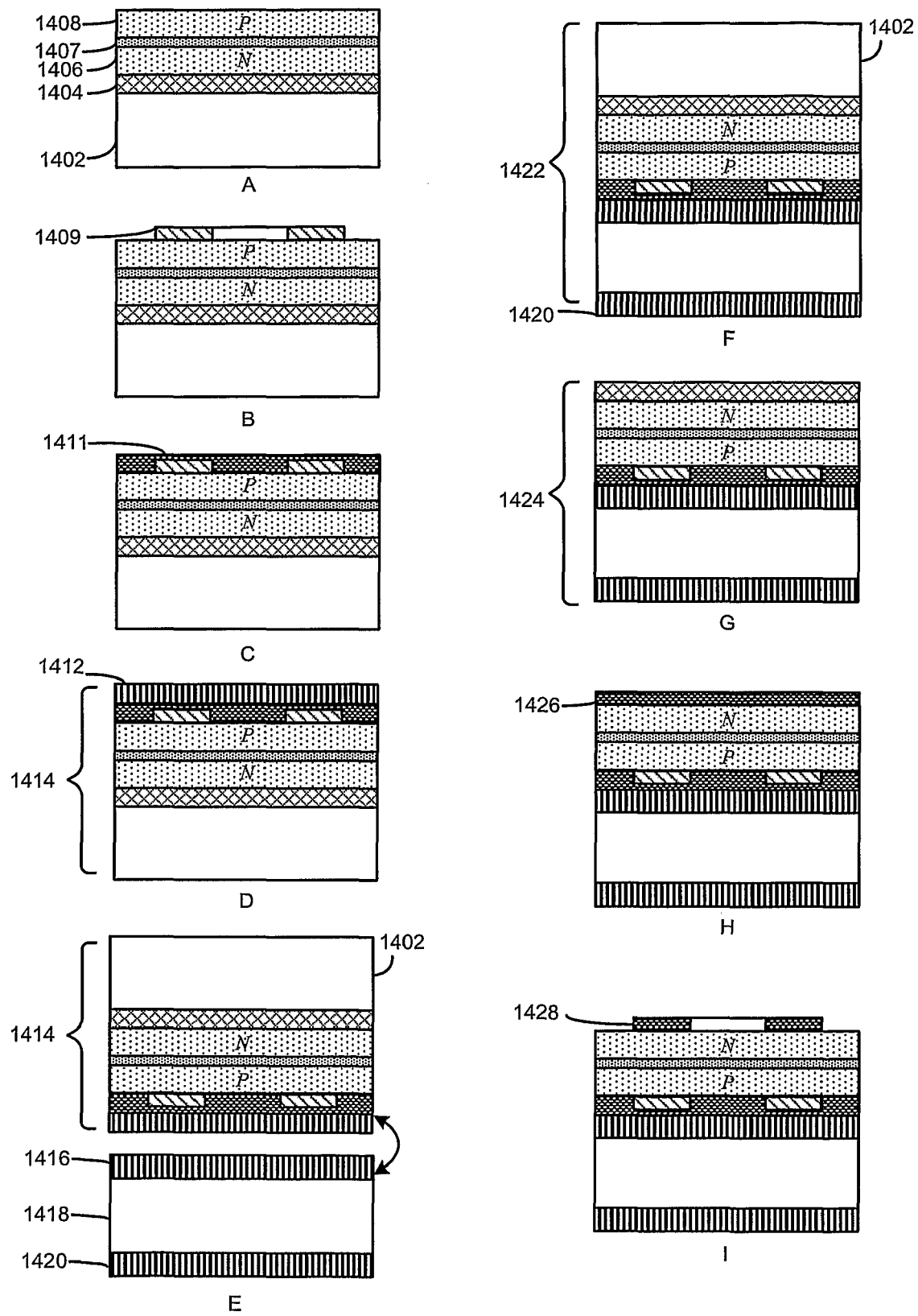
FIG. 14 illustrates a process for fabricating an LED with a buried high-resistance layer between an electrode and the p-type cladding layer in accordance with one embodiment of the present invention.

FIG. 14 illustrates a process for fabricating an LED with a buried high-resistance layer between an electrode and the p-type cladding layer, wherein the upper electrode is of a ring shape, in accordance with one embodiment. In Step A, a GaN device is fabricated on a growth Si substrate 1402. Typically, an InGaAlN buffer layer 1404 is grown on substrate 1402. An n-type GaN layer 1406, which in one embodiment can be Si-doped GaN, is then grown on buffer layer 1404. An InGaN/GaN multi-quantum-well active layer 1407 and a p-type GaN layer 1408 are subsequently grown on n-type GaN layer 1406

In Step B, a layer of high-resistance material, such as $SiO_2$, is deposited using, for example, Plasma Enhanced Chemical Vapor Deposition (PECVD). The $SiO_2$ layer is then patterned and etched to form a ring-shaped insulator layer 1409. Insulator layer 1409 is later used to prevent a p-side electrode from forming a conductive path in certain regions with p-type GaN layer 1408.

In Step C, a reflective ohmic-contact layer 1411 is deposited over insulator layer 1409 and p-type GaN layer 1408. The region of ohmic-contact layer 1411 which is in ohmic contact with p-type GaN layer 1408 is of a shape that is substantially complementary to the shape of insulator layer 1409.

In Step D, a bonding-ohmic-contact layer 1412 is further deposited over ohmic-contact layer 1411. The resulting layered structure 1414 is then flipped upside down and bonded with a low-resistance Si wafer 1418. As is shown in Step E, the bonding side of Si wafer 1418 is coated with a bonding-metal layer 1416. The other side of Si wafer 1418 is coated with a protective layer 1420. In one embodiment, the bonding process occurs under high temperature and high pressure. After bonding, in Step F, a layered structure 1422 is formed which includes two substrates.

In Step G, growth substrate 1402 is removed using wet etching, resulting in structure 1424. Low-resistance Si wafer 1418 is intact because protection layer 1420 protects wafer 1418 from being attacked by the etchant.

In Step H, InGaAlN buffer layer 1404 is etched away to expose n-type GaN layer 1406. Subsequently, an ohmic-contact layer 1426 is deposited over n-type GaN layer 1406. In Step I, ohmic-contact layer 1426 is etched into a ring-shaped upper electrode 1428 using photo lithography.

Figure 15:
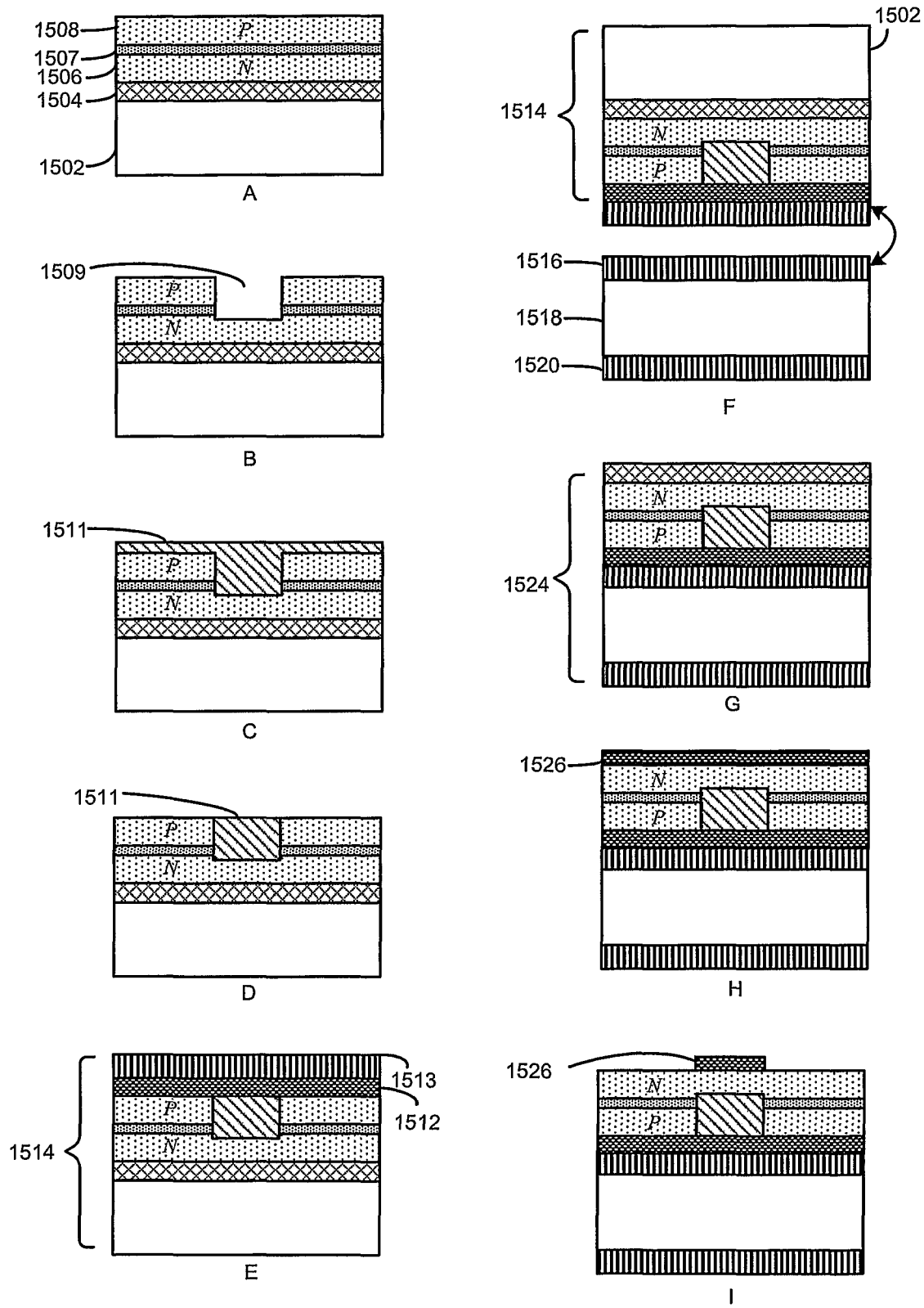
FIG. 15 illustrates a process for fabricating an LED with a buried high-resistance region which penetrates the p-type cladding layer and the active layer in accordance with one embodiment of the present invention.

FIG. 15 illustrates a process for fabricating an LED with a buried insulator which penetrates the p-type cladding layer and the active layer in accordance with one embodiment of the present invention. In this example, the upper electrode is of a circular shape, and the shape of a buried insulator substantially coincides with the shape of the upper electrode.

In Step A, a GaN-based light-emitting device, which includes a buffer layer 1504, an n-type GaN layer 1506, a multi-quantum-well active layer 1507, and a p-type GaN layer 1508, is grown on a growth Si substrate 1502. Subsequently, a portion of p-type GaN layer 1508 and active layer 1507 is etched away to create a void 1509 in Step B.

An insulator material, such as $SiO_2$, is then deposited to fill void 1509 in Step C. Further patterning and etching are applied to remove the excessive insulator material in Step D.

In Step E, an ohmic-contact layer is deposited over p-type GaN layer 1508 and insulator 1511. Next, a bonding layer 1513 is deposited over ohmic-contact layer 1512. The resulting layered structure 1514 is then flipped upside down and bonded with a low-resistance substrate 1518. On the bonding side of low-resistance substrate 1518 is a bonding layer 1516, which in one embodiment comprises the same metal as bonding layer 1513. On the other side of low-resistance substrate 1518 is a conductive protective layer 1520.

Growth substrate 1502 is then removed by wet etching in Step G, resulting in structure 1524. Buffer layer 1504 is further removed in Step H, exposing n-type GaN layer 1506. An ohmic-contact layer 1526 is then deposited, forming an ohmic contact with n-type GaN layer 1506.

In Step I, ohmic-contact layer 1526 is patterned and etched to form a circular-shaped upper electrode 1526. Note that the shape of insulator 1511 substantially coincides with the shape of upper electrode 1526.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor light-emitting device, comprising:
   an upper cladding layer;
   a lower cladding layer;
   an active layer between the upper and lower cladding layers;
   an upper ohmic-contact layer forming a conductive path to the upper cladding layer; and
   a lower ohmic-contact layer forming a conductive path to the lower cladding layer, the lower ohmic-contact layer having a shape that is substantially complementary to the shape of the upper ohmic-contact layer, wherein the lower ohmic-contact layer is formed by removing a portion that is substantially overlapping vertically with the upper ohmic-contact layer, thereby diverting a carrier flow away from a portion of the active layer which is substantially below the upper ohmic-contact layer when a voltage is applied to the upper and lower ohmic-contact layers:
   wherein the removed portion of the lower ohmic-contact layer is filled with a metal material capable of forming a Schottky contact with the lower cladding layer.

2. The semiconductor light-emitting device of claim 1, wherein the material contained in the region where the lower ohmic-contact layer is not present comprises one of: Au, Al, and Ag.

3. The semiconductor light-emitting device of claim 2, wherein the material contained in the region where the lower ohmic-contact layer is not present is reflective with regard to the wavelength of the light emitted by the active layer.

4. The semiconductor light-emitting device of claim 1, further comprising a layer of insulating material situated between the lower cladding layer and the lower ohmic-contact layer; and
 wherein the insulating material is confined to a region substantially below the upper ohmic-contact layer, thereby resulting in majority of carrier recombination occurring in active-layer regions where upward-propagating light is not obstructed by the upper ohmic-contact layer.

5. The semiconductor light-emitting device of claim 1, further comprising a bonding-material layer below the lower ohmic-contact layer and a low-resistance substrate below the bonding-material layer;
 wherein the low-resistance substrate comprises Si;
 wherein the upper and lower cladding layers comprise n-type GaN and p-type GaN, respectively;
 wherein the active layer comprises an InGaN/GaN multi-quantum-well structure; and
 wherein the bonding-material layer comprises Au.

6. A semiconductor light-emitting device, comprising:
 an upper cladding layer;
 a lower cladding layer;
 an active layer between the upper and lower cladding layers;
 an upper ohmic-contact layer forming a conductive path to the upper cladding layer; and
 a lower ohmic-contact layer forming a conductive path to the lower cladding layer;
 wherein the shape of the lower cladding layer, which is in direct contact with the lower ohmic-contact layer, is substantially complementary to the shape of the upper ohmic-contact layer, wherein the complementary shape of the lower cladding layer is formed by removing a portion of the lower cladding layer that is substantially overlapping vertically with the upper ohmic-contact layer, and wherein the removed portion is filled with an insulating material, thereby resulting in majority of carrier recombination occurring in active-layer regions where upward-propagating light is not obstructed by the upper ohmic-contact layer.

7. A method for fabricating a semiconductor light-emitting device, comprising:
 forming a layered semiconductor structure on a growth substrate, the layered semiconductor structure comprising:
  an n-type semiconductor layer;
  an active layer; and
  a p-type semiconductor layer;
 forming a first ohmic-contact layer with a conductive path to a first side of the layered structure;
 removing a portion of the first ohmic-contact layer;
 forming a bonding-material layer over the first ohmic-contact layer;
 bonding a low-resistance substrate onto the bonding-material layer;
 removing the growth substrate to expose a second side of the layered structure; and
 forming a second ohmic-contact layer with a conductive path to the second side of the layered structure, wherein the second ohmic-contact layer is confined within a region which substantially corresponds to the region where the portion of the first ohmic-contact layer is removed, wherein the shape of the second ohmic-contact layer is substantially complementary to the shape of the first ohmic-contact layer; and
 filling the region where the portion of the first ohmic-contact layer is removed with an insulating material, wherein the shape of the filled region is substantially the same as the shape of the second ohmic-contact layer, thereby diverting carrier flow away from a portion within the active layer where vertically emitted light can be substantially obstructed by the second ohmic-contact layer.

8. The method of claim 7, wherein the material used to fill the region where the portion of the first ohmic-contact layer is removed comprises $SiO_2$.

9. The method of claim 7, wherein the first ohmic-contact layer comprises a material that is reflective with regard to the wavelength of the light emitted by the active layer.

10. A method for fabricating a semiconductor light-emitting device, the method comprising:
 forming a layered semiconductor structure above a growth substrate, the layered semiconductor structure comprising:
  an n-type semiconductor layer;
  an active layer; and
  a p-type semiconductor layer;
 removing a portion of the p-type layer and/or the active layer;
 filling the region where the p-type layer and/or the active layer is removed with an insulating material;
 forming a first ohmic-contact layer with a conductive path to the first side of the layered structure, the first ohmic-contact layer covering the insulating-material region;
 forming a bonding-material layer over the first ohmic-contact layer;
 bonding a low-resistance substrate onto the bonding-material layer;
 removing the growth substrate to expose a second side of the layered structure; and
 forming a second ohmic-contact layer with a conductive path to the second side of the layered structure, the second ohmic-contact layer confined within a region which substantially corresponds to the insulating-material region, and wherein the shape of the second ohmic-contact layer is substantially the same as the shape of the insulating-material region, thereby diverting carrier flow away from a portion within the active layer where vertically emitted light can be substantially obstructed by the second ohmic-contact layer.

11. The method of claim 10, wherein the insulating-material region penetrates the p-type layer.

* * * * *